US012603476B2

(12) United States Patent
Arar et al.

(10) Patent No.: US 12,603,476 B2
(45) Date of Patent: Apr. 14, 2026

(54) EXTENDED-CAVITY DIODE LASER COMPONENT AND METHOD FOR PRODUCING SAME

(71) Applicant: FERDINAND-BRAUN-INSTITUT GGMBH LEIBNIZ-INSTITUT FÜR HÖCHSTFREQUENZTECHNIK, Berlin (DE)

(72) Inventors: Bassem Arar, Berlin (DE); Olaf Brox, Berlin (DE); Sergey Nechayev, Berlin (DE); Hans Wenzel, Berlin (DE); Sten Wenzel, Berlin (DE); Andreas Wicht, Berlin (DE); Pietro Della Casa, Berlin (DE)

(73) Assignee: FERDINAND-BRAUN-INSTITUT GGMBH LEIBNIZ-INSTITUT FÜR HÖCHSTFREQUENZTECHNIK, Berlin (DE)

( * ) Notice: Subject to any disclaimer, the term of this patent is extended or adjusted under 35 U.S.C. 154(b) by 118 days.

(21) Appl. No.: 18/276,478

(22) PCT Filed: Jan. 13, 2022

(86) PCT No.: PCT/EP2022/050585
§ 371 (c)(1),
(2) Date: Aug. 9, 2023

(87) PCT Pub. No.: WO2022/171375
PCT Pub. Date: Aug. 18, 2022

(65) Prior Publication Data
US 2024/0113504 A1 Apr. 4, 2024

(30) Foreign Application Priority Data

Feb. 12, 2021 (DE) ..................... 10 2021 103 337.3
Dec. 10, 2021 (DE) ..................... 10 2021 132 717.2

(51) Int. Cl.
*H01S 5/0625* (2006.01)
*H01S 5/026* (2006.01)
(Continued)

(52) U.S. Cl.
CPC ........ *H01S 5/06256* (2013.01); *H01S 5/0261* (2013.01); *H01S 5/1039* (2013.01);
(Continued)

(58) Field of Classification Search
CPC .... H01S 5/06256; H01S 5/125; H01S 5/0265; H01S 5/0261; H01S 5/0287;
(Continued)

(56) References Cited

U.S. PATENT DOCUMENTS 4,896,325 A * 1/1990 Coldren ................. H01S 5/125
372/29.016
5,732,102 A * 3/1998 Bouadma ............ H01S 5/06256
372/50.1
(Continued)

FOREIGN PATENT DOCUMENTS

JP H02126693 A 5/1990
JP H08148750 A 6/1996
(Continued)

OTHER PUBLICATIONS

Price et al. ("Widely Tunable 850-nm Metal-Filled Asymmetric Cladding Distributed Bragg Reflector Lasers", IEEE Journal of Quantum Electronics, vol. 42, No. 7, Jul. 2006, pp. 667-674). (Year: 2006).*
(Continued)

*Primary Examiner* — Michelle R Connelly
(74) *Attorney, Agent, or Firm* — Norris McLaughlin, PA

(57) ABSTRACT

Extended cavity diode laser devices and methods of fabrication are provided, wherein the diode laser devices comprise, in the longitudinal direction, an amplifier section, a
(Continued)

passive propagation section, and a Bragg section. The amplifier section, the propagation section, and the Bragg section are arranged between a front facet and a rear facet, wherein an active layer is formed in of the amplifier section over the entire length of the amplifier section and, in the Bragg section, a surface grating extends over the entire length of the Bragg section, and the surface grating is formed by a plurality of grooves spaced apart from each other in the longitudinal direction.

12 Claims, 2 Drawing Sheets

(51) Int. Cl.

| | |
|---|---|
| *H01S 5/028* | (2006.01) |
| *H01S 5/10* | (2021.01) |
| *H01S 5/12* | (2021.01) |
| *H01S 5/125* | (2006.01) |
| *H01S 5/14* | (2006.01) |

(52) U.S. Cl.
CPC ............ *H01S 5/1231* (2013.01); *H01S 5/125* (2013.01); *H01S 5/141* (2013.01); *H01S 5/0287* (2013.01); *H01S 5/101* (2013.01); *H01S 5/1085* (2013.01); *H01S 2301/163* (2013.01); *H01S 2301/166* (2013.01)

(58) Field of Classification Search
CPC .... H01S 5/0612; H01S 5/026; H01S 5/06258; G02B 6/12004; G02B 2006/12107; G02B 2006/12121
See application file for complete search history.

(56) References Cited

U.S. PATENT DOCUMENTS

| | | | | |
|---|---|---|---|---|
| 6,807,215 | B2 * | 10/2004 | Lam ...................... | B82Y 20/00 |
| | | | | 372/50.1 |
| 6,973,226 | B2 * | 12/2005 | Sato .......................... | H01S 5/12 |
| | | | | 385/40 |
| 2002/0105991 | A1 * | 8/2002 | Coldren ............... | H01S 5/0262 |
| | | | | 372/50.1 |
| 2015/0288140 | A1 | 10/2015 | Davies et al. | |
| 2020/0212653 | A1 | 7/2020 | Kwon et al. | |
| 2022/0102939 | A1 * | 3/2022 | Matsui ................. | H01S 5/4056 |

FOREIGN PATENT DOCUMENTS

| | | |
|---|---|---|
| JP | 2011-049535 A | 3/2011 |
| JP | 2020520112 A | 7/2020 |

OTHER PUBLICATIONS

Crump P et al., "10-W reliable 90micron-wide broad area lasers with internal grating stabilization", High-Power Diode Laser Technology and Applications, vol. 8241, No. 1, pp. 1-8, Feb. 9, 2012.
Lianping Hou et al., "10-GHz Mode-Locked Extended Cavity Laser Integrated With Surface-Etched DBR Fabricated by Quantum-Well Intermixing", IEEE Photonics Technology Letters, vol. 23, No. 2, pp. 82-84, Jan. 15, 2011.
Lianping Hou et al., "Monolithic Mode-Locked Laser With an Integrated Optical Amplifier for Low-Noise and High-Power Operation", IEEE Journal of Selected Topics in Quantum Electronics, vol. 19, No. 4, p. 1100808, Jul. 1, 2013.
Price R.K. et al., "Narrow-linewidth asymmetric cladding distributed Bragg reflector semiconductor lasers at 850 hm", IEEE Photonics Technology Letters, vol. 18, No. 1, pp. 97-99, Jan. 1, 2006.
Michael John Strain et al., "Passively Mode-Locked Lasers With Integrated Chirped Bragg Grating Reflectors", IEEE Journal of Quantum Electronics, vol. 47, No. 4, pp. 492-499, Apr. 1, 2011.
Joseph W Zimmerman et al., "Narrow Linewidth Surface-Etched DBR Lasers: Fundamental Design Aspects and Applications", IEEE Journal of Selected Topics in Quantum Electronics, vol. 19, No. 4, p. 1503712, Jul. 1, 2013.
International Search Report dated Apr. 15, 2022, issued in connection with PCT International Application No. PCT/EP2022/050585.
English translation of International Search Report dated Apr. 15, 2022, issued in connection with PCT International Application No. PCT/EP2022/050585.
Written Opinion issued in connection with PCT International Application No. PCT/EP2022/050585.
Price et al., Widely Tunable 850-nm Metal-Filled Asymmetric Cladding Distributed Bragg Reflector Lasers, IEEE Journal of Quantum Electronic, vol. 42, No. 7, pp. 667-674, Jul. 2006.
English language translation of Office Action dated Oct. 27, 2023, in connection with German Patent Application No. 10 2021132 717.2.
Hansen, P. B., et al.: "5.5-mm Long InGaAsP Monolithic Extended-Cavity Laser with an Integrated Bragg-Reflector for Activ Mode-Locking", IEEE Photonics Technology Letters, No. 3, NY, US, pp. 215-217, Mar. 1992.
JPO Notice of Reasons for Rejection in corresponding Japanese patent application, JP 2023-548248, dated Nov. 18, 2025, along with the English-language translation of Notice.

\* cited by examiner

EXTENDED-CAVITY DIODE LASER COMPONENT AND METHOD FOR PRODUCING SAME

This application is the U.S. National Stage of International Application No. PCT/EP2022/050585, filed Jan. 13, 2022, which claims foreign priority benefits under 35 U.S.C. § 119 of German Application Nos. 10 2021 103 337.3, filed Feb. 12, 2021, and 10 2021 132 717.2, filed Dec. 10, 2021, the disclosures of which are incorporated herein by reference.

The present invention relates to an extended cavity diode laser device, in particular a monolithically integrated ECDL (mECDL) with a Bragg section comprising a surface grating, and a corresponding method of fabrication.

STATE OF THE ART

For the realization of very narrowband lasers, e.g. for use in coherent communication, interferometry, quantum sensing or optical atomic clocks, extended cavity diode lasers (ECDL) are usually used. These consist of a semiconductor-based optical amplifier and external elements that force narrowband, i.e. frequency-selective, optical feedback into the laser chip. A decisive factor for the spectral narrowband characteristics of ECDL compared to monolithic (i.e. semiconductor technology completely integrated in a single optoelectronic semiconductor device) solutions is that this allows a relatively large effective resonator length to be realized, which can be adjusted by selecting the associated propagation path (e.g. air).

Commercially available discretely realized ECDLs are usually only suitable for stationary operation in laboratories. They are too large and heavy and not robust enough for mobile use, since vibration and mechanical shock can lead to de-adjustment of the optical setup and thus to significant degradation of the electro-optical performance parameters, including the laser threshold, output power, side-mode suppression and frequency noise spectral power density.

Monolithically integrated technical solutions for narrowband beam sources also exist. In these diode laser devices, waveguiding is forced by means of a ridge waveguide in the transverse fundamental mode. A grating integrated into the waveguide is used as a frequency-selective element (so-called waveguide-based Bragg grating or Bragg waveguide). In an established embodiment, the grating is formed over the entire length of the waveguide. The entire waveguide is electrically pumped and amplifies the optical radiation. In this case, the device is referred to as a distributed-feedback (DFB) diode laser device. In another embodiment, the grating is implemented only at one end of the rib waveguide. The facet of the device opposite the Bragg waveguide is partially mirrored and together with the Bragg waveguide forms the optical resonator of the laser. Such embodiments are referred to as distributed Bragg reflector (DBR) diode laser devices. Again, the entire waveguide is electrically pumped and amplifies the optical radiation. In another embodiment, the electrical contacting of the device is such that current can be injected into the section of the diode laser device containing the Bragg waveguide independently of other waveguide sections. In this process, the Bragg waveguide can either be electrically pumped or this is optically pumped transparently by the field circulating in the resonator.

Monolithic solutions offer the smallest form factor, enable the highest degree of miniaturization and allow manufacturing at minimal cost. Due to its compactness, a monolithic integrated solution also has the highest possible robustness against mechanical stress (vibration and shock).

DFB and DBR diode laser devices generally do not achieve the spectral linewidths required for precision spectroscopy and coherent communication, especially the linewidths achievable with ECDL. Reasons for this are:

(i) The frequency selective waveguide section is electrically pumped so that the current noise from the current source results in a frequency noise of the resonant frequency of the frequency selective element and thus a frequency noise of the laser.

(ii) The frequency selective waveguide section must be pumped optically transparent. This process involves dissipation and increases the linewidth of the laser. Because of the coupling of optical intensity and effective refractive index in the semiconductor device, the power fluctuation associated with dissipation also leads to a fluctuation in the effective refractive index, and thus to a fluctuation in the laser frequency. Optical pumping for transparency further exploits nonlinear properties of the device and can lead to unstable behavior (formation of a pulse mode).

(iii) The resonator length cannot be set independently of the amplification characteristics, since the entire resonator length (except for the Bragg waveguide, if necessary) is electrically pumped. Since the section amplifying the optical field, the so-called active waveguide section or amplifier section, usually has to be operated well above the transparency current density to achieve narrowband emission, long diode laser devices would have to be operated with a high injection current, but at which optically stable operation is no longer possible. Therefore, resonator lengths exceeding a length of 1 mm to 2 mm are not possible with the DFB and DBR diode laser devices according to the state of the art.

For telecommunication applications (1200 . . . 1600 nm), integration approaches based on semiconductor heterointegration methods of active InAlGaAs layers with photonic silicon-on-insulator (SOI) structures (e.g., Huang et al., Optica 6, 745 (2019)) have been developed to provide chip-based solutions. These approaches are not applicable to the wavelength range achievable with GaAs devices (630 . . . 1180 nm) because the corresponding heterointegration technologies do not exist and silicon is not transparent in this wavelength range.

Li et al. (Li et al., Chin. Phys. B 22, 054211 (2013)) describe a monolithic integration approach for a complex diode laser device in which active and passive waveguides are realized in the same material system. Here, the layer structure for an active diode laser device is first epitaxially grown, then the active layer (multi-quantum well layer) is selectively removed, and finally the epitaxy of the overall layer structure is completed. The device is realized in InGaAsP/InP technology for emission at 1.55 μm. The Bragg reflectors are designed as buried gratings: in buried gratings, the modulation of the effective refractive index is realized by incorporating a spatially-periodically modulated semiconductor material layer into the waveguide core. The device shown consists of four active DFB waveguide sections that generate laser emission at four different frequencies, and passive waveguide sections that couple the emission from the four DFB waveguide sections into a common waveguide and inject the radiation into an active waveguide section.

The active layer selective removal approach has already been used to realize GaAs-based, 2.5 mm DBR diode laser devices for operation at 970 nm, where spectral stabilization is achieved using two sampled gratings forming the two reflectors of the optical resonator (e.g., Tawfieq et al, IET Optoelectron. 11, 73-78 (2017); Brox et al, Electron. Lett. 53, 744-746 (2017)). The scanning gratings are designed as buried gratings in passive waveguide sections. The use of a short intra-cavity passive waveguide section to control the round trip phase of the resonator is also proposed.

All monolithic devices available to date, including those with active and passive waveguides, only achieve line widths such as those obtained with DBR or DFB diode laser devices. These are therefore also not suitable for use in the applications mentioned at the beginning.

To reduce the linewidth of the diode laser device, the round-trip time of the light in the resonator must be increased. This can be achieved with the help of low-loss waveguide sections, which are integrated into the resonator. To guarantee stable single-frequency operation of the laser in the process, the spectral bandwidth of the Bragg wave-guide must be reduced. This requires an extension of the Bragg waveguide section. However, if the design of the structure realizing the Bragg grating remains the same, this lengthening leads to an increase of the diffraction efficiency beyond the optimal value of a few 10%. Increasing the efficiency well beyond 50% results in a reduction of the spectral selectivity of the Bragg waveguide, so that stable single-frequency operation is no longer possible. Therefore, as the length of the Bragg waveguide increases, the diffraction efficiency per unit length, the so-called coupling coefficient, must be reduced. Therefore, several millimeter long Bragg waveguides with a low coupling coefficient are required for the realization of narrowband diode laser devices. However, low coupling coefficients cannot be reliably realized with buried gratings due to the large spatial overlap of the optical field with the periodic grating layer.

In principle, lower coupling coefficients can be achieved with surface gratings, since the overlap of the field with the spatial range of the periodic modulation can be chosen very small. In contrast to buried gratings, the spatially periodic modulation of the effective refractive index along the wave-guide is not realized by a spatially periodically integrated semiconductor layer in the waveguide, but by etching grooves into the waveguide. Surface gratings have been exclusively inscribed into active Bragg waveguides in GaAs and GaN technology so far.

DISCLOSURE OF THE INVENTION

Therefore, it is an object of the present invention to provide a diode laser device which has a sufficient spectral stability (sufficiently low spectral power density of the frequency noise) for the mobile applications mentioned above. Furthermore, a corresponding method for manufacturing such a diode laser device shall be provided.

These objects are solved according to the invention disclosed herein. Useful embodiments of the invention are contained hereinafter. The features listed individually herein can be combined with one another in a technologically useful manner and can be supplemented by explanatory facts from the description and/or details from the figures, whereby further embodiments of the invention are shown.

A diode laser device according to the invention comprises an amplifier section and a Bragg section, wherein the amplifier section and the Bragg section are arranged to form a resonator for an optical radiation along a longitudinal direction between a front facet and a rear facet; wherein the diode laser device has a layer structure formed along a vertical direction perpendicular to the longitudinal direction for wave guiding the optical radiation, wherein the diode laser device has a waveguide structure in a transverse direction perpendicular to the vertical direction and to the longitudinal direction, wherein an active layer is formed in the amplifier section along the entire length of the amplifier section in the layer structure. The diode laser device further comprises, in the longitudinal direction, a passive propagation section for propagating the optical radiation, the propagation section being disposed between the front facet and the Bragg section; and in the Bragg section, a surface grating extends over the entire length of the Bragg section, the surface grating being formed by a plurality of grooves spaced apart in the longitudinal direction. In a preferred embodiment, corresponding waveguide structures (e.g., rib waveguides) may be formed in the sections to guide the optical radiation in the lateral direction.

Preferably, the active layer is not formed over the entire length of the resonator, but is present only in sections in the layer structure. Particularly preferably, exclusively in the amplifier section (or essentially only in the amplifier section) an active layer is formed over the entire length of the amplifier section in the layer structure. This has the advantage that the optical radiation can be guided with less loss in sections that are not amplifier sections. The non-actively pumped material of the active layer present in these segments can otherwise induce additional optical losses through its interaction with the optical radiation guided in the resonator. Essentially only in the amplifier section means here that even with only a small proportion of an active layer section also present outside the amplifier section, a considerable reduction in optical losses can nevertheless be achieved compared to a design with an active layer formed over the entire length of the resonator.

In a specific embodiment, a diode laser device according to the invention has, for example, in the vertical direction, a layer structure on an n-substrate, wherein the layer structure comprises: an n-clad layer, wherein the n-clad layer is disposed on the n-substrate; an n-waveguide layer, wherein the n-waveguide layer is disposed on the n-clad layer; a p-waveguide layer, wherein the p-waveguide layer is disposed on the n-waveguide layer; a p-clad layer, wherein the p-clad layer is disposed on the p-waveguide layer; and a p-contact layer, wherein the p-contact layer is disposed on the p-clad layer. In the longitudinal direction, this embodiment has an amplifier section; a propagation section; and a Bragg section; wherein the amplifier section, the propagation section, and the Bragg section are disposed between a front facet and a rear facet, wherein an active layer is formed in the amplifier section over the entire length between the n-waveguide layer and the p-waveguide layer; and wherein a surface grating extends in the Bragg section over the entire length, the surface grating being formed by a plurality of grooves spaced apart from each other in the longitudinal direction, the grooves extending through the p-contact layer into the p-cladding layer.

A diode laser device according to the invention thus consists of at least three sections. Guiding of the optical radiation in lateral direction with corresponding waveguide structures is preferably done transversally in fundamental mode. The optical field is amplified in the amplifier section. It is preferably between 0.5 mm and 1.5 mm long. The amplifier section is preferably electrically pumped. The cathode can be formed by the substrate of the semiconductor device. The propagation section can be formed by a long and low-loss passive waveguide. It is preferably between 1 mm and 5 mm long, more preferably between 2 mm and 4 mm. The Bragg section can be formed by a long and low loss passive Bragg waveguide with low coupling coefficient. It is preferably between 1 mm and 5 mm long, more preferably between 3 mm and 5 mm. A resonant diffraction efficiency between 10% and 60% is preferred, especially at about 50%. The Bragg section is formed as a surface grating (preferably in air).

A preferred embodiment of a diode laser device according to the invention comprises, for example, AlGaAs cladding layers and GaAs waveguide layers, in which within the amplifier section (preferably exclusively within the amplifier section) an active layer consisting of two InGaAs quantum films is embedded. For example, in a first MOVPE growth step, the vertical structure can be grown to a 20 nm thick GaAs layer above the active layer. This GaAs layer, as well as the active layer, can then be removed in the sections of the device intended as passive sections (i.e., for the propagation section and the Bragg section) using wet chemical etching steps. In the lateral direction, the etched regions can be designed to be tilted by preferably 3° to minimize reflections between regions with (active) and without (passive) active layers. The completion of the generated vertical structure can then be done in a second growth step.

After that, the surface grating can be defined, for example, by means of electron beam lithography (e-beam) and a hard mask process. The grating grooves in the e-beam coating can be set, for example, to a width of 170 nm with a period of 1554 nm, which in the selected vertical structure corresponds to a 10th-order grating for emission at 1064 nm. Surface gratings of 5th to 20th order are preferred. The groove depth may be, for example, 1330 nm. In all other respects, the manufacturing process may correspond to that of a standard process for manufacturing ridge wave guide lasers (RW lasers). For example, in one realized embodiment, the rib waveguide was 1.1 μm deep and 4 μm wide. In this case, the ridge waveguide ran over the entire 8 mm long device. The longitudinal sections were (starting from the rear) a 2 mm long DBR grating in the Bragg section, a 5 mm long passive propagation section, and a 1 mm long active amplifier section.

Preferably, the length of the propagation section is selected such that the diode laser device has a free spectral range of at most 6 GHz. Preferably, the spectral bandwidth of the surface grating is less than or equal to the free spectral range of the diode laser device. Preferably, the surface grating has a coupling coefficient of a few 0.1 mm$^{-1}$, preferably between 0.1 mm$^{-1}$ and 0.9 mm$^{-1}$, in particular a coupling coefficient between 0.4 mm-1 and 0.7 mm$^{-1}$. Preferably, the grooves of the surface grating extend into the layer structure. Preferably, the Bragg section is passive.

Preferably, the front facet is partially mirrored for a power reflectivity between 1% and 35%. Preferably, the rear facet is non-reflective. Also, preferably, the resonant diffraction efficiency of the surface grating is between 10% and 60%, particularly preferably around 50%.

The front facet of the device is preferably suitably partially mirrored. A preferred power reflectivity for GaAs technology designs is 5%. Another preferred power reflectivity for designs in GaAs technology is 30%. The rear facet of the device is preferably anti-reflective. In these embodiments, most of the optical power is coupled out of the device through the front facet.

Preferably, the front facet is mirrored for a power reflectivity greater than 95%. Preferably, the rear facet is non-reflective. It is also preferred that the resonant diffraction efficiency of the surface grating is between 3% and 30%, particularly preferred around 5%.

In this case, the front facet of the device is highly reflective (preferably R>95%) and the surface grating is designed with a lower resonant diffraction efficiency, preferably 5%. In these embodiments, most of the optical power is thus coupled out of the device through the rear facet.

Preferably, detuning of the emission frequency of a diode laser device according to the invention is performed by a resistive heating element in the amplifier section, the propagation section and/or the Bragg section.

In particular, in the propagation section at least one resistive heater running close to the resonator axis (or to the waveguide) can be technologically integrated semiconductors (so-called waveguide heater). With a resistive heater, the optical length of the propagation section and thus the emission frequency of the laser can be continuously changed thermally. The control of the current through the heater elements allows a continuous variation of the emission wavelength in a frequency range in the order of the free spectral range.

Alternatively, or additionally, at least one resistive heating semiconductor extending in the vicinity of the resonator axis (or waveguide) can also be technologically integrated in the Bragg section. It can be used to thermally change the Bragg resonant frequency of the surface grating and thus the emission frequency of the laser. Control of the current through the heating elements allows selection of the longitudinal mode of the laser, i.e. variation of the emission wavelength mainly in steps of the size of the free spectral region.

Thus, with suitably tuned control of the currents through the heating elements, continuous detuning of the emission frequency of the laser can be achieved over a frequency range that is a multiple of the free spectral range.

Preferably, a diode laser device according to the invention comprises, in the longitudinal direction, a second amplifier section, the second amplifier section being shorter than the amplifier section. Since the second amplifier section is designed shorter, this allows a faster modulation of the injection current and thus a faster modulation of the frequency and optical power of the emitted radiation because of the low electrical capacitance. The second amplifier section can be integrated in longitudinal direction at any position in the diode laser device.

In some embodiments of the invention, the function of a facet as a resonator mirror can be replaced by another Bragg waveguide integrated in front of the facet in a second Bragg section, so that the optical resonator is formed by two Bragg waveguides. In this case, in preferred embodiments both facets can also be antireflection coated. Alternatively, one facet may be uncoated or both facets may be uncoated.

Preferably, decoupling of the generated laser radiation can be accomplished by couplers alternative to facet decoupling. For example, (i) vertical coupling with Bragg grating, e.g. upwards or downwards, or (ii) evanescent coupling into a waveguide.

Preferably, the diode laser device comprises in longitudinal direction a second propagation section, wherein the second propagation section is directly adjacent to the front facet. This allows the thermal load on the front facet to be reduced.

Preferably, at least one propagation section and/or at least one Bragg section has an electrical contact via which the effective refractive index of the corresponding section can be changed by applying a voltage in the reverse direction. In particular, the waveguide of the first and/or second propagation section may be formed with an electrical contact. By applying a reverse-bias voltage between the anode (e.g., via a contact pad) and the cathode (e.g., substrate), the effective refractive index of the passive waveguide of the corresponding propagation section can be changed by exploiting the electro-optical effect. This changes the optical length of the resonator and thus the emission frequency. Because of the very small time constants of the electro-optical effect, very fast continuous frequency changes can be achieved. When the second propagation section is made short, the electrical capacitance of the section is low, allowing very fast and broadband modulation.

Alternatively, or additionally, the Bragg section can also be formed with an electrical contact. By applying a voltage in the reverse direction between the anode (e.g. via a contact pad) and cathode (e.g. substrate), the effective refractive index of the passive waveguide of the Bragg section can be changed by exploiting the electro-optical effect. This changes the resonant frequency of the Bragg waveguide. Because of the very small time constants of the electro-optical effect, the resonant frequency can thus be changed very quickly.

Preferably, the surface normal of the abutting surface between two adjacent sections includes an angle α with a propagation direction of the optical radiation in the resonator. Preferably, in the lateral direction, the etched regions can be formed inclined by 1° to 10°, preferably by 3°, in order to minimize reflections between regions with (active) and without (passive) active layer in a diode laser device according to the invention.

Preferably, optical radiation transmitted through the Bragg section can be guided out of the device by a passive waveguide that is curved and low-loss in a third propagation section. By curving the waveguide, it can be achieved that the waveguide hits the rear facet at a suitable angle, so that feedback of the optical field by reflection at the rear facet is minimized. The rear facet may be anti-reflective to further reduce optical field feedback due to reflection at the rear facet. This is particularly relevant if most of the optical power from the device is coupled out via the rear facet.

Preferably, the active layer is formed as a single or multi-quantum well structure, or as a quantum dot structure in a GaAs, InP or GaN material system. Different wavelength ranges can be realized by the material system. The proposed structure systems for the active layer are thereby preferred for the excitation of the narrowest possible emission.

The above embodiments may advantageously be combined with each other in whole or in part.

In particular, a long and low-loss passive Bragg waveguide with a low coupling coefficient can be formed in the Bragg section of a diode laser device according to the invention. Its length should be chosen as long as possible so that the Bragg waveguide has a spectrally as narrow-band reflection spectrum as possible. The reasonable length is limited, among other things, by the residual losses of the passive waveguide and technically unavoidable inhomogeneities in the periodicity of the grating of the Bragg waveguide. The Bragg waveguide preferably has a resonant diffraction efficiency between 10% and 60%, especially preferably between 15% and 25%. A preferred length of the Bragg section is between 1 mm and 5 mm, especially between 3 mm and 5 mm.

The optical field transmitted through the Bragg waveguide can be guided out of the device by a bent, passive, low-loss waveguide formed in a third propagation section.

In the propagation section a long and low-loss passive waveguide can be formed. The length of the waveguide should be chosen as large as possible, so that the longest possible round-trip time for the light field in the resonator, i.e. the smallest possible free spectral range and thus the smallest possible fundamental linewidth can be achieved. The reasonable length is limited, among other things, by the residual losses of the passive waveguide and by the spectral bandwidth of the Bragg waveguide; if the free spectral range is too small in relation to the spectral bandwidth of the Bragg waveguide, stable single-frequency operation is not guaranteed. A preferred length of the propagation section is between 1 mm and 5 mm, especially between 3 mm and 4 mm.

The optical field can be amplified in the active waveguides of the amplifier section and a second amplifier section. The overall length of the amplifier section and the second amplifier section should be selected so that the device achieves the desired output power. A preferred overall length of the amplifier section and the second amplifier section is between 1 mm and 5 mm, in particular between 1 mm and 2 mm. The length of the active waveguide of the second amplifier section should be chosen as short as possible. This makes the electrical capacitance of the second amplifier section much smaller than the sum of the electrical capacitances of the two sections with active waveguide, so that fast modulation of the current is possible. Current can be injected into the anode of the active waveguide via electrical contacts. The common cathode can be formed by the substrate.

A short, passive, low-loss waveguide can be formed in a second propagation section. The integration of a passive waveguide at the front facet reduces its thermal load. An electrical contact can be formed in the second propagation section. By applying a voltage in the reverse direction between the anode and cathode, the effective refractive index of the passive waveguide of the second propagation section can be changed by exploiting the electro-optical effect. This changes the optical length of the resonator and thus the emission frequency. Because of the small time constants of the electro-optical effect, continuous frequency changes can be achieved very quickly. Since the second propagation section is made short, the electrical capacitance of the section is low, allowing broadband modulation. A preferred length of the second propagation section is between 0.1 mm and 1 mm, more preferably between 0.4 mm and 0.6 mm. The front facet is preferably mirrored (preferably R>95%).

In the propagation section, a resistive heater running along the waveguide can be formed in the vicinity of the waveguide using semiconductor technology. It can be used to continuously change the optical length of the passive waveguide and thus the emission frequency of the laser thermally. An electrical contact can be formed in the propagation section. By applying a voltage in the reverse direction between the anode and cathode, the effective refractive index of the passive waveguide of the propagation section can be changed by exploiting the electro-optical effect. This changes the optical length of the resonator and thus the emission frequency. Because of the low time constants of the electro-optical effect, continuous frequency changes can be achieved very quickly. In principle, the same functionality is achieved here as in a second propagation section described above. Because of the greater length of the propagation section compared to the second propagation section, a greater frequency deviation can be represented at the same voltage, but the electrical capacitance is greater and the electrically achievable bandwidth is therefore less than in the second propagation section.

In the Bragg section, a resistive heater extending along the waveguide can be semiconductor-engineered in proximity to the waveguide. It can be used to thermally change the Bragg resonant frequency of the Bragg waveguide and thus the emission frequency of the laser. With suitable synchronization of the heating currents for the waveguide heaters, the emission of the laser can be continuously shifted by significantly more than a free spectral range. An electrical contact may be formed in the Bragg section. By applying a voltage in the reverse direction between the anode and cathode, the effective refractive index of the Bragg waveguide and thus the resonant frequency of the Bragg waveguide can be changed by exploiting the electro-optical effect. Compared to the change by means of waveguide heating, the change by means of the electro-optical effect is much faster because of the much shorter time constants of the electro-optical effect, but the achievable frequency change is much smaller because of the relatively small strength of the electro-optical effect.

In a second aspect, the invention relates to a method of manufacturing a diode laser device according to the invention, comprising forming an amplifier section and a Bragg section, the amplifier section and the Bragg section being arranged to form a resonator for an optical radiation along a longitudinal direction between a front facet and a rear facet; wherein the diode laser device has a layered structure formed for waveguiding the optical radiation along a vertical direction perpendicular to the longitudinal direction, wherein the diode laser device has a waveguide structure formed in a transverse direction perpendicular to the vertical direction and the longitudinal direction, wherein an active layer is formed in the amplifier section along the entire length of the amplifier section in the layered structure; wherein said diode laser device comprises, in a longitudinal direction, a passive propagation section for propagating said optical radiation, said propagation section being disposed between said front facet and said Bragg section; and in said Bragg section, a surface grating extends over the entire length of said Bragg section, said surface grating being formed by a plurality of grooves spaced apart from each other in said longitudinal direction.

Preferably, the active layer is not formed over the entire length of the layered structure, but is present in the layered structure only in sections. Particularly preferably, an active layer is formed exclusively in the amplifier section (or essentially only in the amplifier section) over the entire length of the amplifier section in the layer structure. This has the advantage that the optical radiation can be guided with less loss in sections that are not amplifier sections. The non-actively pumped material of the active layer present in these segments can otherwise induce additional optical losses through its interaction with the optical radiation guided in the resonator. Essentially only in the amplifier section means that even if only a small proportion of an active layer section is also present outside the amplifier section, a considerable reduction in optical losses can still be achieved compared to a design with an active layer formed over the entire length of the layer structure.

An active layer present only in sections can be provided in particular by a direct selective formation of a locally restricted active layer during the generation of the layer structure. Alternatively, after a non-selective spatial formation of the active layer over the entire length of the layered structure, this outside the amplifier sections can also be removed selectively accordingly. Furthermore, ion implantation using quantum well intermixing (e.g., D. Hofstetter et al., IEEE J. Sel. Top. Quantum Electron 4, 794-802, (1998);

Tan et al, A. Integrated Photonics Research and Applications/Nanophotonics, Technical Digest (CD) (Optical Society of America, 2006), paper ITuE2) selective deactivation or passivation can be performed on a non-selectively formed active layer for its subsequent conversion in areas outside the amplifier section.

In a specific embodiment, a method according to the invention comprises providing an n-substrate; and forming the layer structure, wherein the active layer of an amplifier section is integrated by selectively forming the active layer, or is selectively removed outside the amplifier section after a non-selective formation of the active layer or is selectively deactivated by ion implantation using interband. In the case of non-selective formation of the active layer, the is completed after the patterning of the active layer is completed.

In addition, further preferred embodiments of the method according to the invention result directly from the features mentioned for the device in the description.

Thus, for the realization of very narrowband diode lasers, the ECDL approaches described in the prior art section and realized discretely so far are used for an integrated structure. For telecommunication applications, approaches of hetero-integration of active InAlGaAs or InP layers with silicon-on-insulator (SOI) waveguide structures are available, which are not transferable to the wavelength range achievable with GaAs technology. A monolithic counterpart to the ECDL, i.e., an integration of a DBR laser with a long optical cavity (free spectral range typically 6 GHZ) in a uniform material system with a fundamental linewidth corresponding to that of a discretely integrated ECDL, is not yet known in any material system (e.g., GaAs, InP, GaN material system), especially not in the GaAs material system. Furthermore, the reliably controlled realization of long passive Bragg waveguides, where the coupling coefficient is so low that the resonant diffraction efficiency of the Bragg waveguide is a few 10%, is not known in GaAs, InP or GaN technology.

The present invention thus discloses, for the first time, a monolithically integrated diode laser device that has a fundamental linewidth equivalent to that of discrete integrated ECDL. A diode laser device according to the invention is therefore also referred to as a monolithically integrated ECDL (mECDL). Here, the following features are combined:

(i) The diode laser device can basically be described as a distributed Bragg reflector (DBR) laser (DBR laser concept).

(ii) A passive waveguide of the longest possible length and with the lowest possible loss is integrated into the laser resonator. This increases the round-trip time of the light in the optical resonator compared to known DBR diode laser components and creates a prerequisite for the formation of a small fundamental linewidth. The maximum possible useful length is limited, among other things, by the optical losses in the passive waveguides and technically feasible component lengths (currently a maximum of about 8 . . . 10 mm). It is also limited by the minimum achievable spectral bandwidth of the Bragg waveguide (see point (iii)): if the free spectral range becomes significantly smaller than the spectral bandwidth of the Bragg waveguide, reliable single-mode operation of the diode laser device is no longer possible. To adjust the round-trip time of the light in the optical resonator, the length of the low-loss passive waveguide can be selected to be large enough to achieve a preferred free spectral range of 6 GHz. Longer lengths are also preferred, which then lead to smaller free spectral ranges.

(iii) A long and low-loss passive Bragg waveguide with a resonant diffraction efficiency of preferably 50% is integrated into the diode laser device as one of the two reflectors of the resonator. In this case, the Bragg waveguide should preferably be long enough so that the spectral bandwidth of the Bragg reflector is comparable to or smaller than the free spectral range of the diode laser device. Thus, the Bragg waveguide can be designed with such a narrow bandwidth that stable single frequency operation of the diode laser device can be guaranteed even with a small free spectral range (see point (ii)). For the realization of long Bragg waveguides, very low coupling coefficients (preferably a few $0.1 \text{ mm}^{-1}$) must be realized.

(iv) To realize Bragg waveguides with a low coupling coefficient, a surface grating is implemented. Unlike buried gratings, in a surface grating, the spatially-periodic modulation of the effective refractive index along the waveguide is not realized by a semiconductor layer spatially-periodically integrated into the waveguide, but by etching grooves into the waveguide. Since the field strength of the optical field at the surface of the waveguide is very low, a small coupling coefficient can be reliably set by suitable geometric design of the grooves, in particular the groove depth.

A diode laser device according to the invention has the functionality required for use in precision spectroscopy. From the electro-optical point of view, a complete optical resonator is formed (optical resonator and intra-cavity optical amplifier). With an additional use of synchronized waveguide heaters, the emission frequency of the laser can be continuously changed by several free spectral ranges with time constants much smaller than 1 ms. Very fast frequency changes with time constants around a few us can be achieved by fast control of the injection current of the amplifier section or by exploiting the electro-optical effect by applying an electrical voltage in reverse direction in the passive waveguide sections. Thus, the high bandwidth requirements of a laser frequency control system for use in optical atomic clocks or in coherent satellite communications can be met.

In particular, the diode laser device according to the invention can replace discretely integrated, spectrally narrowband ECDLs for the spectral range of 630 . . . 1180 nm achievable with GaAs as a monolithically integrated ECDL (mECDL) with respect to function and electro-optical performance. Compared to all existing solutions, which are all realized in discrete macroscopic or discrete microoptic miniaturization, the following advantages are achieved:

(i) The form factor of the laser (volume) is significantly reduced, even by several orders of magnitude depending on the discretely integrated reference system.

(ii) Due to the reduction of the form factor and the monolithic realization, the laser system according to the invention does not exhibit any mechanical resonance frequencies in the acoustic frequency range (up to a few 10 kHz). Mechanical disturbances of the operating environment (vibration and shock) therefore have a much smaller effect on the spectral stability of the diode laser than in discretely integrated lasers. The diode laser devices according to the invention are therefore much more suitable for use under acceleration and vibration, i.e. in particular for mobile use.

(iii) The bandwidths achievable for frequency control are increased by the use of waveguide heaters and the electro-optical effect in accordance with the invention, compared to the bandwidths achievable with thermally or piezoelectrically discretely integrated systems. With the electro-optical effect, time constants well below 1 us are achievable, while with waveguide heaters, time constants of below 1 ms are possible. In discretely integrated systems, fast frequency control is achieved via the injection current with time constants of at least 1 μs, in the acoustic frequency range piezoelectrically with time constants significantly greater than 10 μs (typically 100 μs), and thermally with time constants significantly greater than 1 s. The diode laser device according to the invention is therefore much more agile with respect to frequency control. This facilitates frequency stabilization and reduces the achievable minimum frequency error during frequency stabilization.

(iv) Manufacturing costs are reduced by at least 1 order of magnitude for a mECDL according to the invention compared to conventional ECDL systems.

Further preferred embodiments of the invention result from the features mentioned herein.

The various embodiments of the invention mentioned in this application can be advantageously combined with each other, unless otherwise specified in the individual case.

BRIEF DESCRIPTION OF THE DRAWINGS

The invention and the technical environment are explained in more detail below with reference to the accompanying figures. It should be noted that the invention is not intended to be limited by the examples of embodiments given. In particular, unless explicitly shown otherwise, it is also possible to extract partial aspects of the facts explained in the figures and combine them with other components and findings of the present description. It shows.

DETAILED DESCRIPTION OF THE DRAWINGS

Figure 1:
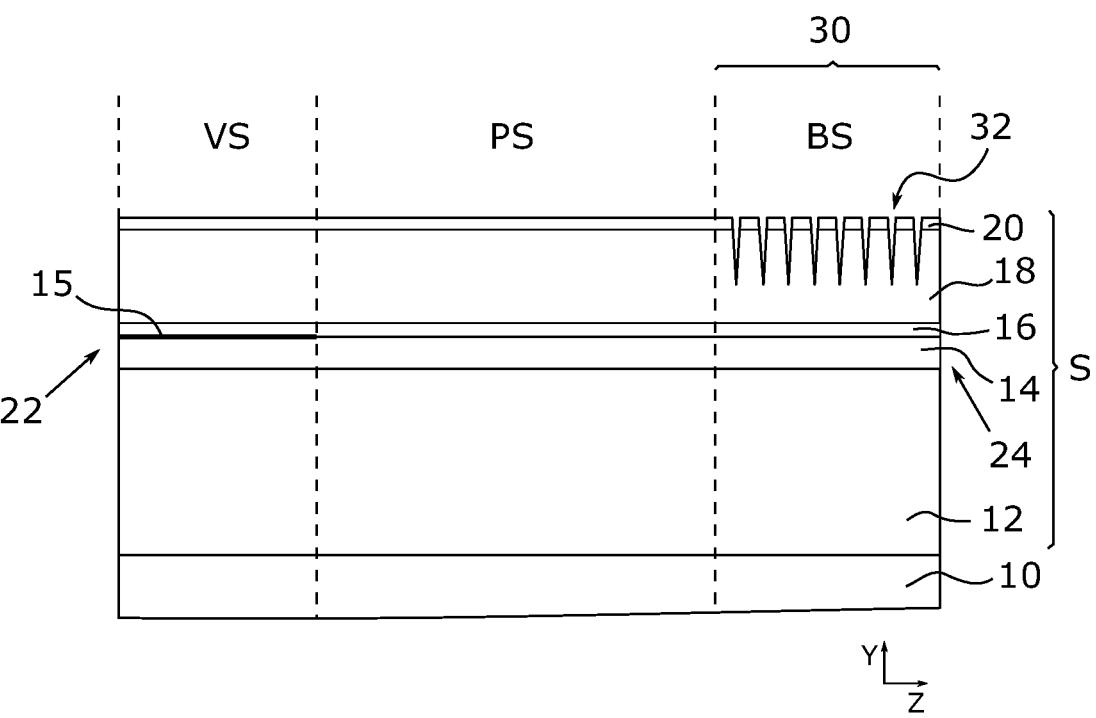
FIG. 1 a schematic representation of a first embodiment of a diode laser device according to the invention in sectional view.

FIG. 1 shows a schematic representation of a first embodiment of a diode laser component according to the invention in sectional view. The diode laser component shown has a layer structure S deposited on an n-substrate 10 in the vertical direction Y. The layer structure S comprises an n-cladding layer 12, wherein the n-cladding layer 12 is disposed on the n-substrate 10; an n-waveguide layer 14, wherein the n-waveguide layer 14 is disposed on the n-cladding layer 12; a p-waveguide layer 16, wherein the p-waveguide layer 16 is disposed on the n-waveguide layer 14; a p-cladding layer 18, wherein the p-cladding layer 18 is disposed on the p-waveguide layer 16; and a p-contact layer 20, wherein the p-contact layer 20 is disposed on the p-cladding layer 18. In the longitudinal direction Z, the diode laser device comprises a amplifier section VS, a propagation section PS, and a Bragg section BS; wherein the amplifier section VS, the propagation section PS, and the Bragg section BS are disposed between a front facet 22 and a rear facet 24; wherein an active layer 15 is formed between the n-waveguide layer 14 and the p-waveguide layer 18 exclusively in the amplifier section VS over the entire length; and wherein exclusively in the Bragg section BS a surface grating 30 extends over the entire length of the Bragg section BS, the surface grating 30 being formed by a plurality of grooves 32 spaced apart from each other in the longitudinal direction Z, the grooves 32 extending through the p-contact layer 20 into the p-cladding layer 18.

Figure 2:
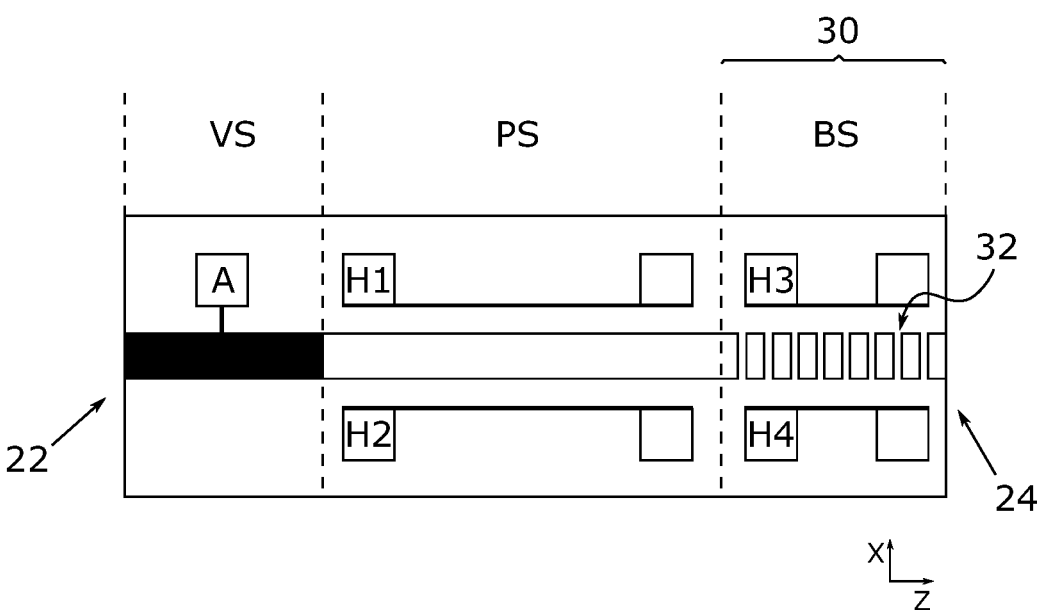
FIG. 2 a schematic representation of the first embodiment of a diode laser device according to the invention as shown in FIG. 1 in a structural top view.

FIG. 2 shows a schematic representation of the first embodiment of a diode laser device according to the invention as shown in FIG. 1 in a structural top view. The view shown indicates a possible arrangement of structures on the top side (i.e. the p-side) of the diode laser component, whereby the central area with the continuous waveguide is only drawn in for illustration purposes and may not be visible at all in the structuring in a real top view. In this purely exemplary illustration, the amplifier section VS has an electrical contact A (contact pad) for charge carrier injection. A detuning of the emission frequency of the diode laser device can be achieved by two resistive heating elements H1-H4 in the amplifier section VS and/or the Bragg section BS via further electrical contacts (contact pads). Preferably, the active layer 15 is formed as a single or multi-quantum well structure, or as a quantum dot structure in a GaAs, InP or GaN material system.

Figure 3:
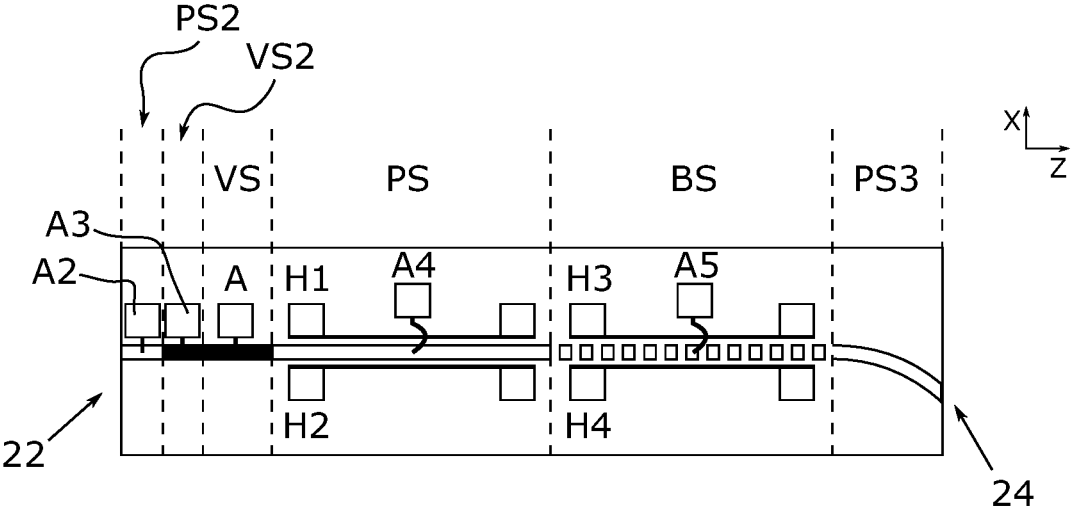
FIG. 3 a schematic representation of a second embodiment of a diode laser device according to the invention in a structural top view.

FIG. 3 shows a schematic top view of a second embodiment of a diode laser device according to the invention. This embodiment basically corresponds to the embodiment shown in FIGS. 1 and 2, except for an extension of the number of sections. The reference signs and their assignment to the individual features therefore apply accordingly. The diode laser device shown comprises, in the longitudinal direction Z, a second amplifier section VS2, the second amplifier section VS2 being shorter than the amplifier section VS. As a result, the amplifier section VS and the second amplifier section VS2 have different electrical capacitances. Preferably, a charge carrier injection takes place via the associated electrical contacts A, A2, via which the modulation efficiency at high modulation frequencies for both amplifier sections VS, VS2 can be increased by operating the diode laser device at a smaller electrical capacitance. Immediately adjacent to the front facet 22 is a second propagation section PS2. This can reduce the thermal load on the front facet 22. Furthermore, a third propagation section PS3 is formed as a curved waveguide section. The curvature serves as a mode filter for radiation of undesired transverse modes of higher order into the material of the layer structure S as well as for reduction of an optical feedback by reflection at the rear facet 24.

Figure 4:
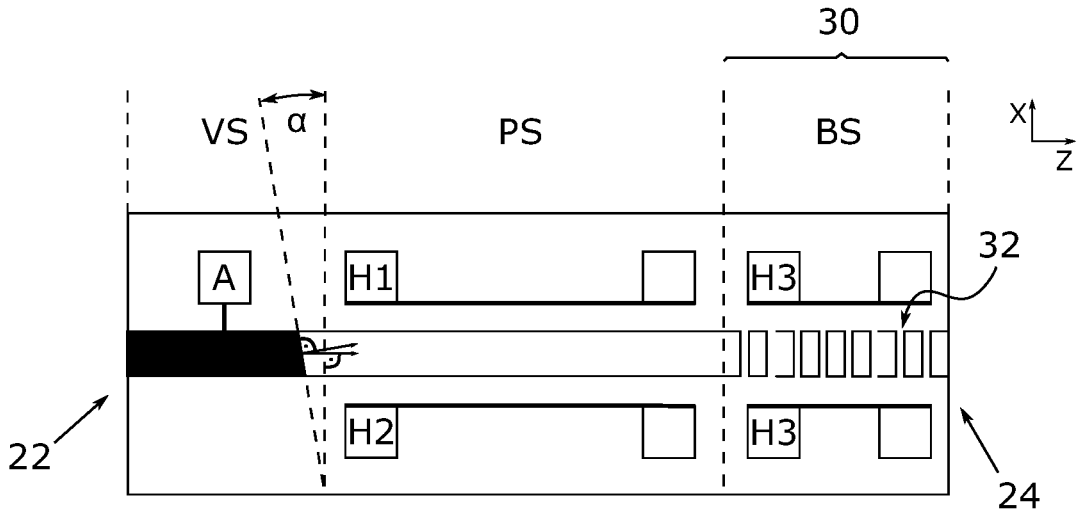
FIG. 4 a schematic representation of a third embodiment of a diode laser device according to the invention in a structural top view.

FIG. 4 shows a schematic representation of a third embodiment of a diode laser device according to the invention in a structural top view. This embodiment corresponds largely to the embodiment shown in FIGS. 1 and 2. The reference signs and their assignment to the individual features therefore apply accordingly. However, the surface normal of the abutting surface between the amplifier section VS and the immediately adjoining propagation section PS includes an angle α with a propagation direction of the optical radiation in the resonator. However, a corresponding mutual tilting of abutting surfaces may also involve other adjacent or contiguous sections. Such tilting serves the internal suppression of undesired back reflections at the respective abutting surface. Preferably, the angle α is a few degrees (e.g. α=3°).

LIST OF REFERENCE SIGNS

10 N substrate
12 N cladding layer
14 N waveguide layer
15 Active layer
16 P waveguide layer
18 P cladding layer
20 P contact layer
22 Front facet
24 Rear facet
30 Surface grating
32 Grooves
S Layer structure
VS Amplification section (VS)
VS2 Second amplification section
VS3 Third amplification section
PS Propagation Section (PS)
PS2 Second propagation section
PS3 Third propagation section
BS Bragg section (BS)
A, A2-A5 Electrical contacts
H1-H4 Resistive heating elements (with electrical contacts)
Y Vertical direction
Z longitudinal direction
α Angle

The invention claimed is:

1. A diode laser device comprising an amplifier section and a Bragg section, the amplifier section and the Bragg section being arranged along a longitudinal direction between a front facet and a rear facet to form a resonator for an optical radiation; wherein the diode laser device has a layer structure formed along a vertical direction perpendicular to the longitudinal direction for waveguiding the optical radiation, wherein the diode laser device has a waveguide structure in a transverse direction perpendicular to the vertical direction and the longitudinal direction, wherein an active layer is formed in the amplifier section over the entire length of the amplifier section in the layer structure;

wherein the diode laser device comprises in longitudinal direction a passive propagation section for propagation of the optical radiation, the propagation section being arranged between the front facet and the Bragg section, wherein the length of the propagation section is chosen such that the diode laser device has a free spectral range of at most 6 GHz; and a surface grating extends in the Bragg section over the entire length of the Bragg section, the surface grating being formed by a plurality of grooves spaced apart from each other in the longitudinal direction, the spectral bandwidth of the surface grating is less than or equal to the free spectral range of the diode laser device, and the surface grating has a coupling coefficient between 0.1 mm$^{-1}$ and 0.9 mm$^{-1}$.

2. The diode laser device of claim 1, wherein the grooves of the surface grating extend into the layer structure.

3. The diode laser device of claim 1, wherein the Bragg section is passive.

4. The diode laser device of claim 1, wherein the front facet is partially mirrored for a power reflectivity between 1% and 35%, the rear facet is anti-reflective, and the resonant diffraction efficiency of the surface grating is between 10% and 60%.

5. The diode laser device of claim 1, wherein the front facet is mirrored for power reflectivity greater than 95%, the rear facet is anti-reflective, and the resonant diffraction efficiency of the surface grating is between 3% and 30%.

6. The diode laser device of claim 1, wherein a detuning of the emission frequency of the diode laser device is performed by a resistive heating element in the amplifier section and/or the Bragg section.

7. The diode laser device of claim 1, wherein the diode laser device comprises, in the longitudinal direction, a second amplifier section, the second amplifier section being shorter than the amplifier section.

8. The diode laser device of claim 1, wherein the diode laser device comprises, in the longitudinal direction, a second propagation section, the second propagation section being immediately adjacent to the front facet.

9. The diode laser device of claim 1, wherein a propagation section and/or a Bragg section comprises an electrical contact via which the effective refractive index of the section can be changed by applying a voltage in the reverse direction.

10. The diode laser device of claim 1, wherein the surface normal of the abutting surface between two adjacent sections includes an angle ($\alpha$) with a direction of propagation of optical radiation in the resonator.

11. The diode laser device of claim 1, wherein the active layer is formed as a single or multi-quantum well structure, or as a quantum dot structure in a GaAs, InP or GaN material system.

12. A method of manufacturing a diode laser device of claim 1, comprising forming an amplifier section and a Bragg section, wherein the amplifier section and the Bragg section are arranged to form a resonator for an optical radiation along a longitudinal direction between a front facet and a rear facet;

wherein the diode laser device has a layer structure formed along a vertical direction perpendicular to the longitudinal direction for waveguiding the optical radiation, wherein the diode laser device has a waveguide structure in a transverse direction perpendicular to the vertical direction and to the longitudinal direction, wherein an active layer is formed in the amplifier section over the entire length of the amplifier section in the layer structure;

wherein the diode laser device comprises, in the longitudinal direction, a passive propagation section for propagating the optical radiation, the propagation section being located between the front facet and the Bragg section, wherein the length of the propagation section is chosen such that the diode laser device has a free spectral range of at most 6 GHz; and wherein a surface grating extends in the Bragg section along the entire length of the Bragg section, the surface grating being formed by a plurality of grooves spaced apart from each other in the longitudinal direction, wherein the spectral bandwidth of the surface grating is less than or equal to the free spectral range of the diode laser device and the surface grating has a coupling coefficient between 0.1 $mm^{-1}$ and 0.9 $mm^{-1}$.

* * * * *